United States Patent

Tsutsumi et al.

[11] Patent Number: 5,999,068
[45] Date of Patent: Dec. 7, 1999

[54] SURFACE ACOUSTIC WAVE FILTER OF MULTI-STAGE CONNECTION TYPE

[75] Inventors: Jun Tsutsumi; Osamu Ikata; Yoshio Satoh, all of Kawasaki, Japan

[73] Assignee: Fujitsu Limited, Kawasaki, Japan

[21] Appl. No.: 09/041,784

[22] Filed: Mar. 13, 1998

[30] Foreign Application Priority Data

Aug. 29, 1997 [JP] Japan ................................. 9-234216

[51] Int. Cl.⁶ .............................. H03H 9/25; H03H 9/64
[52] U.S. Cl. .................... 333/193; 333/195; 310/313 B; 310/313 D
[58] Field of Search ................................. 333/193–196; 310/313 R, 313 B, 313 C, 313 D

[56] References Cited

U.S. PATENT DOCUMENTS

| 4,999,535 | 3/1991 | Mariani et al. ...................... 310/313 B |
| 5,581,141 | 12/1996 | Yamada et al. ...................... 333/195 X |
| 5,793,266 | 8/1998 | Allen et al. ............................. 333/193 |

FOREIGN PATENT DOCUMENTS

| 2-11012 | 1/1990 | Japan ..................................... 333/195 |
| 3-259610 | 11/1991 | Japan ..................................... 333/193 |
| 4-81012 | 3/1992 | Japan ..................................... 333/193 |
| 5-129884 | 5/1993 | Japan . | |
| 6-164297 | 6/1994 | Japan ..................................... 333/194 |
| 6-276046 | 9/1994 | Japan . | |
| 6-310978 | 11/1994 | Japan . | |
| 7-22891 | 1/1995 | Japan . | |
| 7-22892 | 1/1995 | Japan . | |
| 7-7369 | 1/1995 | Japan . | |

*Primary Examiner*—Robert Pascal
*Assistant Examiner*—Barbara Summons
*Attorney, Agent, or Firm*—Armstrong, Westerman, Hattori, McLeland & Naughton

[57] ABSTRACT

A surface acoustic wave filter of multi-stage connection type including a plurality of surface acoustic wave filters formed on a piezoelectric substrate and a connection section for electrically connecting the surface acoustic wave filters in a cascade connection. Each of the surface acoustic wave filters includes interdigital transducers with two signal terminals for electric input and output, each interdigital transducer including an excitation section for exciting a surface acoustic wave and two terminal sections disposed on opposite sides of the excitation section, the two terminal sections serving as input or output terminal for electric signal and ground terminal. One of the signal terminal sections is connected to the connection section, and an electrode area of said one of the signal terminal sections is adjusted so that a parasitic capacitance formed between said one of the signal terminal sections and a grounding point of the surface acoustic wave filter is less than or equal to 0.01 pF.

7 Claims, 14 Drawing Sheets

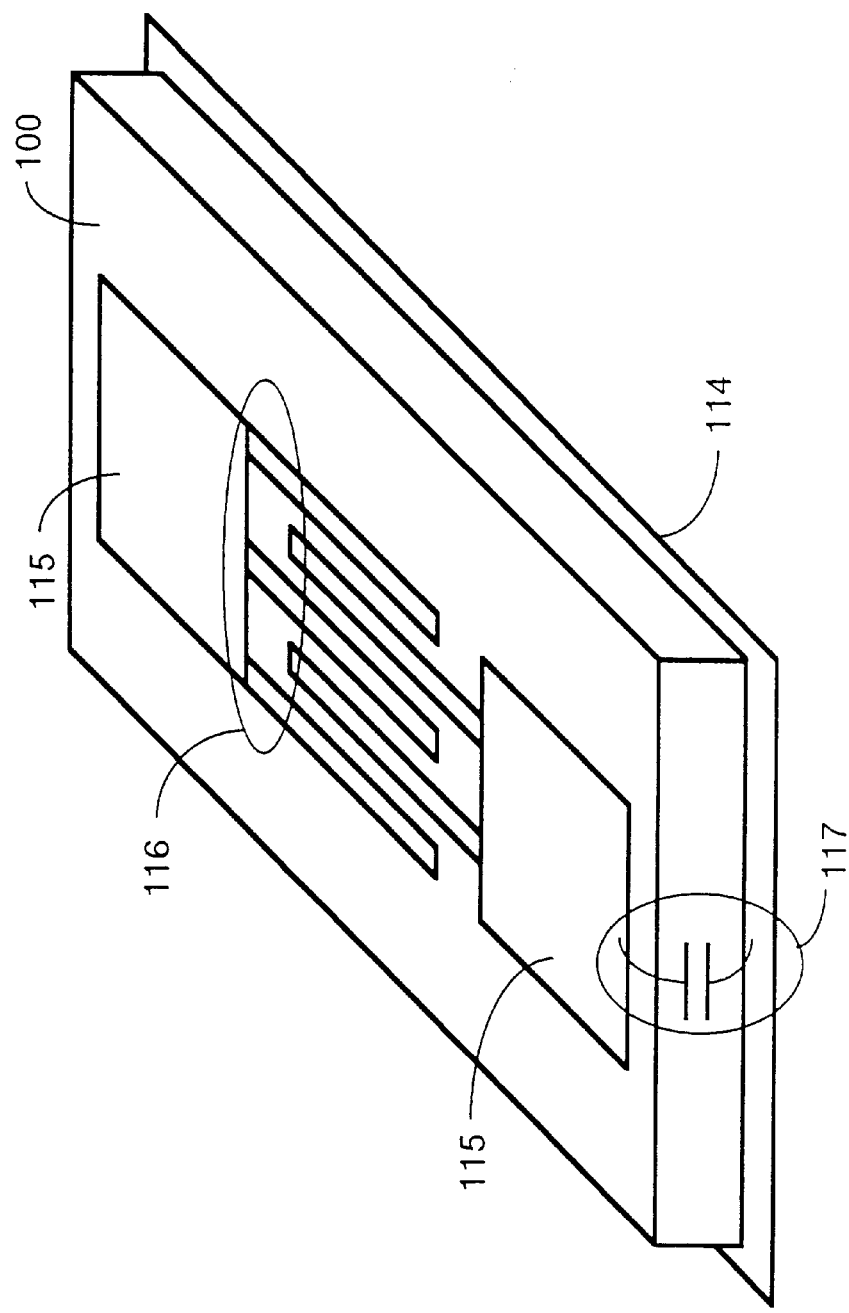

SURFACE ACOUSTIC WAVE FILTER OF MULTI-STAGE CONNECTION TYPE

CROSS-REFERENCES TO RELATED APPLICATIONS

This application is related to Japanese Patent Application No. HEI 09-234216, filed on Aug. 29, 1997 whose priority is claimed under 35 USC §119, the disclosure of which is incorporated herein by reference in its entirety.

BACKGROUND OF THE INVENTION

1. Field of the Invention

The present invention relates to a surface acoustic wave filter of multi-stage connection type. More particularly, the present invention relates to a surface acoustic wave filter in which a plurality of surface acoustic wave filters are connected in a multi-stage connection (cascade connection).

2. Description of the Related Arts

Surface acoustic wave filters are gaining popularity as a filter for a transmitting/receiving circuit of a small communication apparatus such as a portable phone.

A surface acoustic wave filter, especially resonator type surface acoustic wave filter is formed of an electrode pattern formed on a piezoelectric substrate, including an interdigital transducer (hereafter referred to as IDT) and reflectors disposed on both sides of the IDT. A surface acoustic wave is excited inside of this electrode pattern. Also, a surface acoustic wave filter of multi-stage connection type is proposed in which a plurality of surface acoustic wave filters are serially connected.

FIG. 12 shows a construction of a conventional surface acoustic wave filter of multi-stage connection type. This filter includes a plurality of surface acoustic wave filters (109, 110) of transversal coupling type connected serially via a metal electrode film (cascade connection section 102).

Generally, IDT 107 includes an excitation section formed of a plurality of electrode fingers as well as a terminal-side bus bar 103 and a connection-side bus bar 104 disposed on upper and lower sides of the IDT. As an example of IDT in the surface acoustic wave filter, there has been developed a filter such that a line width of an electrode finger and an interval between electrode fingers are each 3.2 μm; an electrode period λ of IDT is 12.8 μm; a width of a terminal-side bus bar 103 and a connection-side bus bar 104 along an up-and-down direction of the drawing is about 15λ.

FIG. 13 is a circuit block diagram of the surface acoustic wave filter shown in FIG. 12. A filter chip 113 of FIG. 13 corresponds to the surface acoustic wave filter formed on a piezoelectric substrate 100 of FIG. 12. Generally, matching circuits 111, 112 are attached to an input side and an output side of the filter chip 113 for providing an impedance matching with an external circuit. Also, in such a surface acoustic wave filter including connection via the cascade connection section 102, an impedance mismatching often occurs also at the cascade connection section 102, causing an extremely great loss at that section.

Therefore, an external circuit (an inductor L in the drawing) as shown in FIGS. 12 and 13 is added to provide an impedance matching at the cascade connection section 102. For this external circuit, various kinds of circuits are proposed (Japanese Unexamined Patent Publication Nos. Hei 5(1993)-129884, Hei 6(1994)-276046, Hei 6(1994)-310978, Hei 7(1995)-7369, Hei 7(1995)-22891, Hei 7(1995)-22892).

However, the proposed matching circuits are accompanied by a drawback that the cost of the entire filter rises due to an increased area of the filter including this external circuit and the increased number of circuit elements, since the matching circuit is attached to an outside of the filter chip.

Here, the impedance mismatching in the cascade connection section 102 is caused by a capacitance component included in parallel with an input impedance and an output impedance of each surface acoustic wave filter. The capacitance component is, for example, a "parasitic capacitance" existing in each surface acoustic wave filter.

FIG. 14 is a view for explaining the parasitic capacitance at the IDT portion of the surface acoustic wave filter. The IDT includes an electrode finger section disposed at its center portion and bus bars 115 disposed on both sides of the electrode finger section. The electrode finger section includes a plurality of electrode fingers meshing with each other in a lattice-like configuration. The IDT is formed on a piezoelectric substrate 100 and is electrically insulated from a bottom 114 of the filter chip package.

Now, it is believed that the parasitic capacitance exists in portions 116 and 117 enclosed by ellipses as shown in FIG. 14. In other words, one parasitic capacitance (117) is a capacitance of a plate capacitor formed between the bus bar 115 of IDT and the bottom 114 of the package; and the other capacitance (116) is a capacitance existing in the vicinity of a tip of each electrode finger in the electrode finger section of IDT and a connecting portion of an electrode finger adjacent the tip with the bus bar 115. The impedance mismatching at the cascade connection section 102 will be reduced if this parasitic capacitance decreases.

SUMMARY OF THE INVENTION

The purpose of the present invention is to decrease a parasitic capacitance for reducing an impedance mismatching at a cascade connection section without adding an external circuit to the cascade connection section in a surface acoustic wave filter of multi-stage connection type in which a plurality of surface acoustic wave filters are connected in cascade.

The present invention provides a surface acoustic wave filter of multi-stage connection type comprising: a plurality of surface acoustic wave filters formed on a piezoelectric substrate; and a connection section for electrically connecting the surface acoustic wave filters in a cascade connection, each of the surface acoustic wave filters comprising interdigital transducers with two signal terminals for electric input and output, the interdigital transducer including an excitation section for exciting a surface acoustic wave and two terminal sections disposed on opposite sides of the excitation section, the two terminal sections serving as input or output signal terminal for electric signal and ground terminal. Here, according to one aspect of the present invention, the surface acoustic wave filter of multi-stage connection type of the present invention is characterized in that, in addition to the above construction, one of the signal terminal sections is connected to the connection section, and an electrode area of said one of the signal terminal sections is adjusted so that a parasitic capacitance formed between said one of the signal terminal sections and a grounding point of the surface acoustic wave filter is less than or equal to 0.01 pF.

Further, according to another aspect, the surface acoustic wave filter of multi-stage connection type of the present invention is characterized in that one of the signal terminal sections is connected to the connection section, and an electrode area of said one of the signal terminal sections connected to the connection section is less than an electrode area of the other of the signal terminal sections of the interdigital transducer in which said one of the signal terminal sections is included.

Furthermore, accorging to still another aspect, the surface acoustic wave filter of multi-stage connection type of the present invention is characterized in that the excitation section includes a plurality of electrode fingers alternately extending from the two signal terminal sections in a direction perpendicular to a propagation direction of the surface acoustic wave, and a width of a portion of an electrode finger which is in contact with the signal terminal section and at which the electrode fingers are not interlaced with each other is less than a width of a portion of the electrode finger at which the electrode fingers are interlaced with each other as viewed from a direction parallel to the propagation direction of the surface acoustic wave.

BRIEF DESCRIPTION OF THE DRAWINGS

The present invention will be better understood from the following detailed description of preferred embodiments of the invention, taken in conjunction with the accompanying drawings, in which:

FIG. 14 is a view for explaining a parasitic capacitance at an IDT portion of a surface acoustic wave filter.

DETAILED DESCRIPTION OF THE PREFERRED EMBODIMENTS

Figure 1:
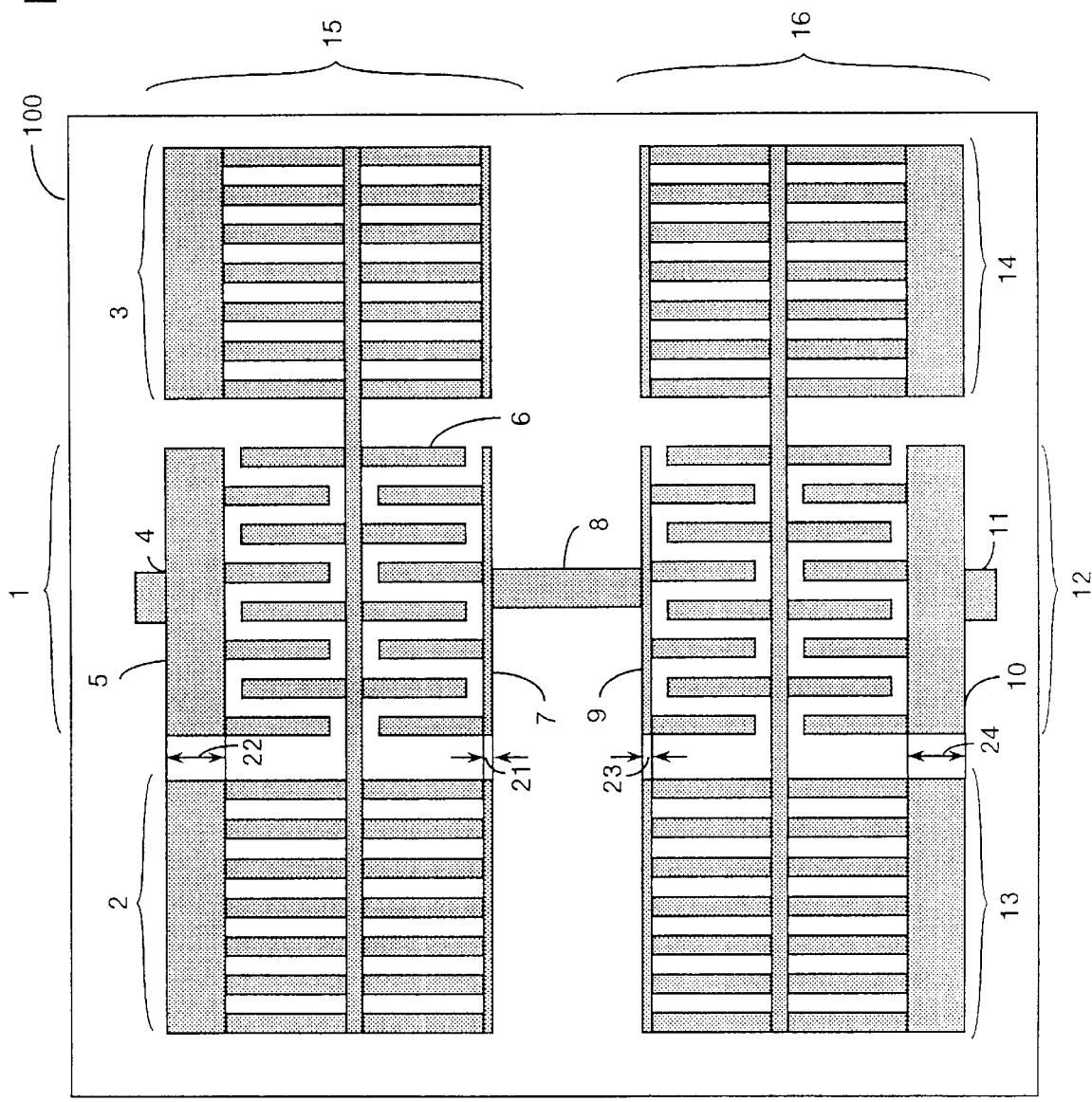
FIG. 1 is a view showing a construction of a surface acoustic wave filter of multi-stage connection type according to the present invention.

A surface acoustic wave filter of multi-stage connection type according to the present invention comprises a plurality of surface acoustic wave filters formed on a piezoelectric substrate and a connection section for electrically connecting the surface acoustic wave filters in a cascade connection. An electrode area which forms a parasitic capacitance in the surface acoustic wave filters and in the connection section is adjusted so that the parasitic capacitance is below a predetermined level.

The piezoelectric substrate to be used in the present invention may be formed of any material as long as a surface acoustic wave is generated thereon. The material may be a conventional one such as $LiTaO_3$, $LiNbO_3$, or $Li_2B_4O_7$. However, the present invention is especially effective when quartz is used as the substrate material because its relative dielectric constant is small and a variation in adjustment of an input impedance is small.

The surface acoustic wave filter produces a particularly excellent effect when a multimode filter of transversal coupling type, which is often used in multi-stage connection, is formed on a quartz substrate. However, the same effect may be obtained by using a surface acoustic wave filter of longitudinal coupling type or a filter of transversal type.

The IDT and the connection section constituting the surface acoustic wave filter are formed of an electrically conductive metal film such as aluminum Al, gold Au, copper Cu, or titanium Ti.

Further, in order to reduce the parasitic capacitance in the present invention, it is preferable that the electrode area of said one of the signal terminal sections is less than or equal to $\frac{1}{15}$ of an electrode area of said other signal terminal section.

One of the two terminal signal sections constituting the IDT is electrically connected to the connection section. Here, a "parasitic capacitance" is formed between said one of the two signal terminal sections and a grounding point of the surface acoustic wave filter. The grounding point of the surface acoustic wave filter is, for example, a metallic film on a package base in which the piezoelectric substrate is mounted. The grounding point is located on a side opposite to the surface of the piezoelectric substrate on which the IDT and the like are formed. In addition to this, the parasitic capacitance may possibly be formed between various sites of the surface acoustic wave filters and the ground.

The present invention mainly aims at reducing the parasitic capacitance formed at two sites (116, 117) shown in FIG. 14. Specifically, a first parasitic capacitance 117 is formed between one signal terminal section of the IDT and the grounding point of the surface acoustic wave filter, and a second parasitic capacitance 116 is formed between a tip of each electrode finger constituting the IDT and a portion of the other signal terminal section to which an electrode finger adjacent to the tip is connected.

In order to reduce the first parasitic capacitance 117, the area of said one signal terminal section is preferably as small as possible.

FIG. 1 shows a construction of the surface acoustic wave filter of multi-stage connection type for reducing the first parasitic capacitance 117 according to the present invention. Referring to FIG. 1, two multimode filters of transversal coupling type 15, 16 are connected in two stages via a cascade connection section 8. It is to be noted that the construction is not specifically limited to the one shown in FIG. 1.

The multimode filter 15 of transversal coupling type in the first stage is a surface acoustic wave filter of signal input side, to which an electric signal is inputted from an input terminal 4. A center portion of the filter 15 is an input-side IDT 1, and two reflectors 2, 3 are disposed on both sides of the IDT 1. The IDT 1 includes an excitation section and two signal terminal sections 5, 7. The excitation section is formed of a plurality of electrode fingers 6. Hereafter, the signal terminal section connected to the input terminal 4 is referred to as a terminal-side bus bar 5, and the signal terminal section connected to the cascade connection section 8 is referred to as a connection-side bus bar 7.

The multimode filter 16 of transversal coupling type and the output-side IDT 12 have the same construction as shown above. However, the output terminal 11 is a portion for outputting the detected surface acoustic wave as an electric signal.

Electrode patterns for the IDTs 1, 12, the reflectors 2, 3, 13, 14 and the cascade connection section 8 in FIG. 1 are all formed of a metal film such as aluminum on the same piezoelectric substrate.

According to a first embodiment of the present invention shown in FIG. 1, an electrode area of the connection-side bus bar 7 is sufficiently small. Referring to FIG. 1, the terminal-side bus bars 5, 10 and the connection-side bus bars 7, 9 constituting the IDTs 1, 12 each have a rectangular shape of equal width which is elongated in a right-and-left direction of the document sheet. Therefore, the widths 21, 23 of the connection-side bus bars 7, 9 are allowed to be smaller than the widths 22, 24 of the terminal-side bus bars 5, 10 in order to reduce the area.

This allows the parasitic capacitance formed between the connection-side bus bars 7, 9 and the ground to be reduced. A principle for the reduction of parasitic capacitance is explained below.

Generally, the multimode filter of transversal coupling type shown in FIG. 1 is formed on a surface of a piezoelectric substrate 100. The piezoelectric substrate 100 is mounted on the metal film formed on the base of a filter package. A rear surface of the piezoelectric substrate 100 on which the electrode patterns of the IDT, reflectors, and the cascade connection section are not formed is in contact with the housing which is usually connected to the ground.

Since the piezoelectric substrate itself is made of an insulator such as quartz, the first parasitic capacitance 117 is formed via the piezoelectric substrate 100 between the connection-side bus bars 7, 9 and the rear surface of the piezoelectric substrate 100 which is in contact with the housing. The first parasitic capacitance can be approximated by a capacitance of a plate capacitor.

Generally, the capacitance of the plate capacitor is represented by the following formula:

$$C = \epsilon_0 \cdot \epsilon_r \cdot S/t \quad (1)$$

wherein C is a capacitance of the plate capacitor (the first parasitic capacitance); $\epsilon_0$ is a vacuum dielectric constant; $\epsilon_r$ is a relative dielectric constant of the piezoelectric substrate; S is the electrode area of the connection-side bus bars 7, 9; and t is a thickness of the piezoelectric substrate.

From this formula, it is understood that the first parasitic capacitance C is in proportion to the electrode area S of the connection-side bus bars 7, 9. Therefore, the first parasitic capacitance decreases by reduction of the electrode area S of the connection-side bus bars 7, 9.

Figure 2:
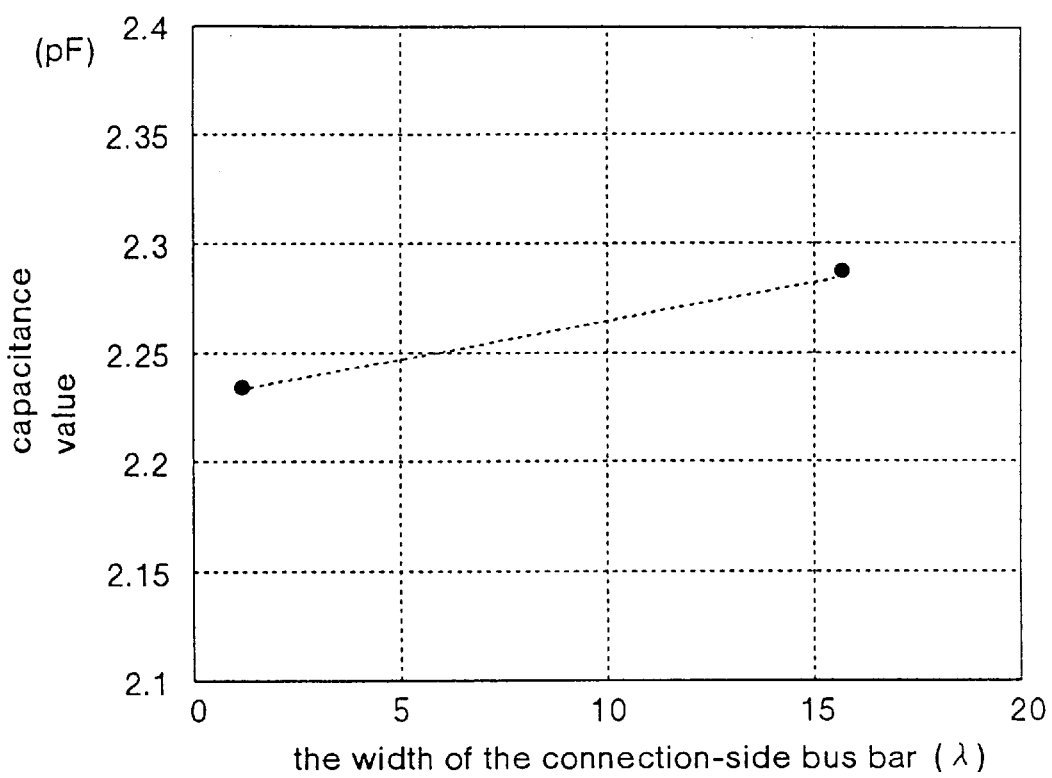
FIG. 2 is a graph representing a relationship between a width of a connection-side bus bar and a capacitance contained in an input impedance according to the present invention.

FIG. 2 is a graph showing a relationship between the widths 21, 23 of the connection-side bus bars 7, 9 and the capacitance value contained in an input impedance of the multimode filters 15, 16 of transversal coupling type according to the first embodiment of the present invention. An ST-cut quartz with a thickness (t) of about 350 $\mu$m is used for the piezoelectric substrate 100. A multimode filter of transversal coupling type shown in FIG. 1 is formed on the piezoelectric substrate 100. In the IDTs 1, 12 and the reflectors 2, 3, 13, 14 of the multimode filter of transversal coupling type, the electrode period is $\lambda$=12.5 $\mu$m; the electrode film thickness is 0.36 $\mu$m; the number of electrode finger pairs in the IDTs 1, 12 is 250; the overlapping width of the electrode fingers 6 is 7$\lambda$; and the width (22, 24) of the terminal-side bus bars 5, 10 is approximately 15$\lambda$.

FIG. 2 shows a capacitance value when the width 21, 23 of the connection-side bus bars 7, 9 is 15$\lambda$ and a capacitance value when the width is 1$\lambda$. FIG. 2 shows that the capacitance value is about 2.29 pF when the width of the connection-side bus bars 7, 9 is the same (i.e. 15$\lambda$) as that of the terminal-side bus bars 5, 10, whereas the capacitance value is about 2.23 pF when the width of the connection-side bus bars is smaller (i.e. 1$\lambda$) than that of the terminal-side bus bars.

Theoretically, according to the formula (1), the capacitance decreases by about 0.06 pF when the width of the connection-side bus bars 7, 9 is reduced from 15$\lambda$ to 1$\lambda$. This theoretical decrease in the capacitance is approximately the same as the observed capacitance shown above. Further, when the width of the connection-side bus bars 7, 9 is 1$\lambda$, it is calculated from the formula (1) that, although the first capacitance 117 still exists, it is as small as 0.004 pF.

Therefore, as shown in FIG. 2, it is appreciated that the observed capacitance value contained in the input impedance of the filter is on the order of several picofarads, and the first parasitic capacitance fraction (0.004 pF) contained therein is smaller by more than two orders of magnitude.

Thus, the fact that the first parasitic capacitance 117 is smaller (below 0.01 pF) by more than two orders of magnitude as compared with the capacitance fraction of the input impedance usually present in the filter implies that the first parasitic capacitance has been reduced to an almost negligible value.

Figure 3:
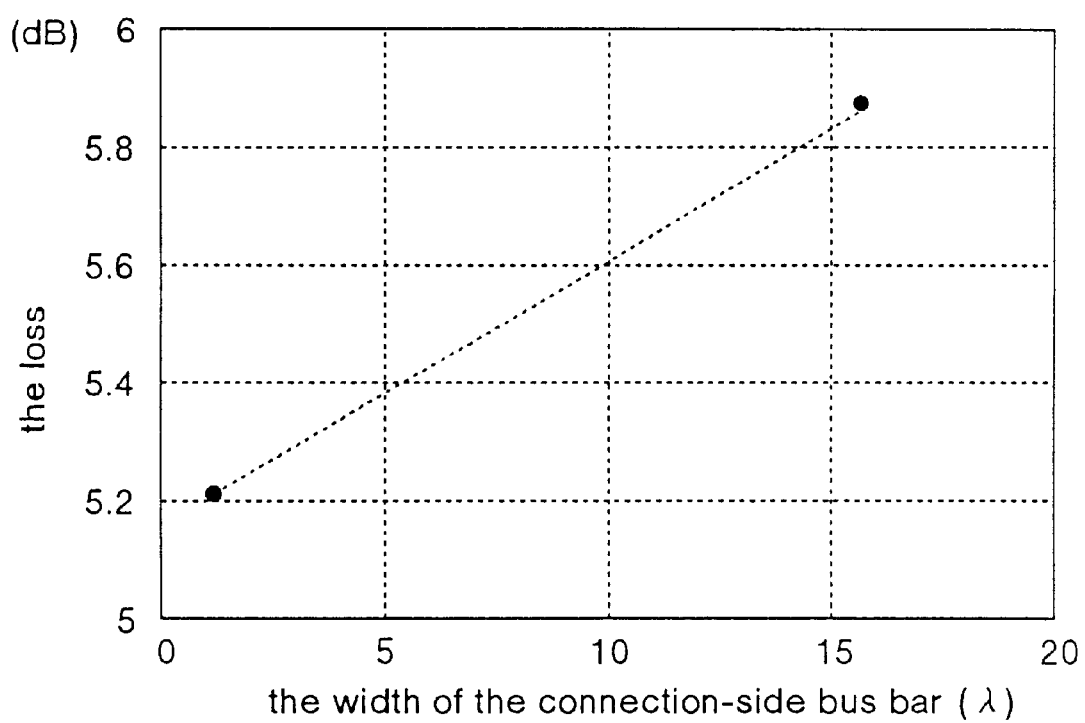
FIG. 3 is a graph representing a relationship between the width of the connection-side bus bar and an insertion loss according to the present invention.

FIG. 3 is a graph showing a relationship between the width 21, 23 of the connection-side bus bars 7, 9 and the loss in the cascade connection section 8 according to the first embodiment of the present invention. FIG. 3 shows that the loss decreases by about 0.6 dB when the width 21, 23 of the connection-side bus bars 7, 9 is 1$\lambda$, as compared with the case in which the width is 15$\lambda$. Thus, it is appreciated that the loss, which is a cause of impedance mismatching, tends to decrease if the width of the connection-side bus bars 7, 9 is reduced.

In other words, reduction in the electrode area of the connection-side bus bars 7, 9 decreases the loss and reduces the impedance mismatching at the cascade connection section 8.

Here, it is to be noted that the construction shown in FIG. 1 is merely an example, and it is not specifically limited as long as the electrode area of the connection-side bus bars 7, 9 is sufficiently small. Namely, the width 21, 23 of the connection-side bus bars need not be reduced, and the connection-side bus bars need not have a rectangular shape.

Figure 4:
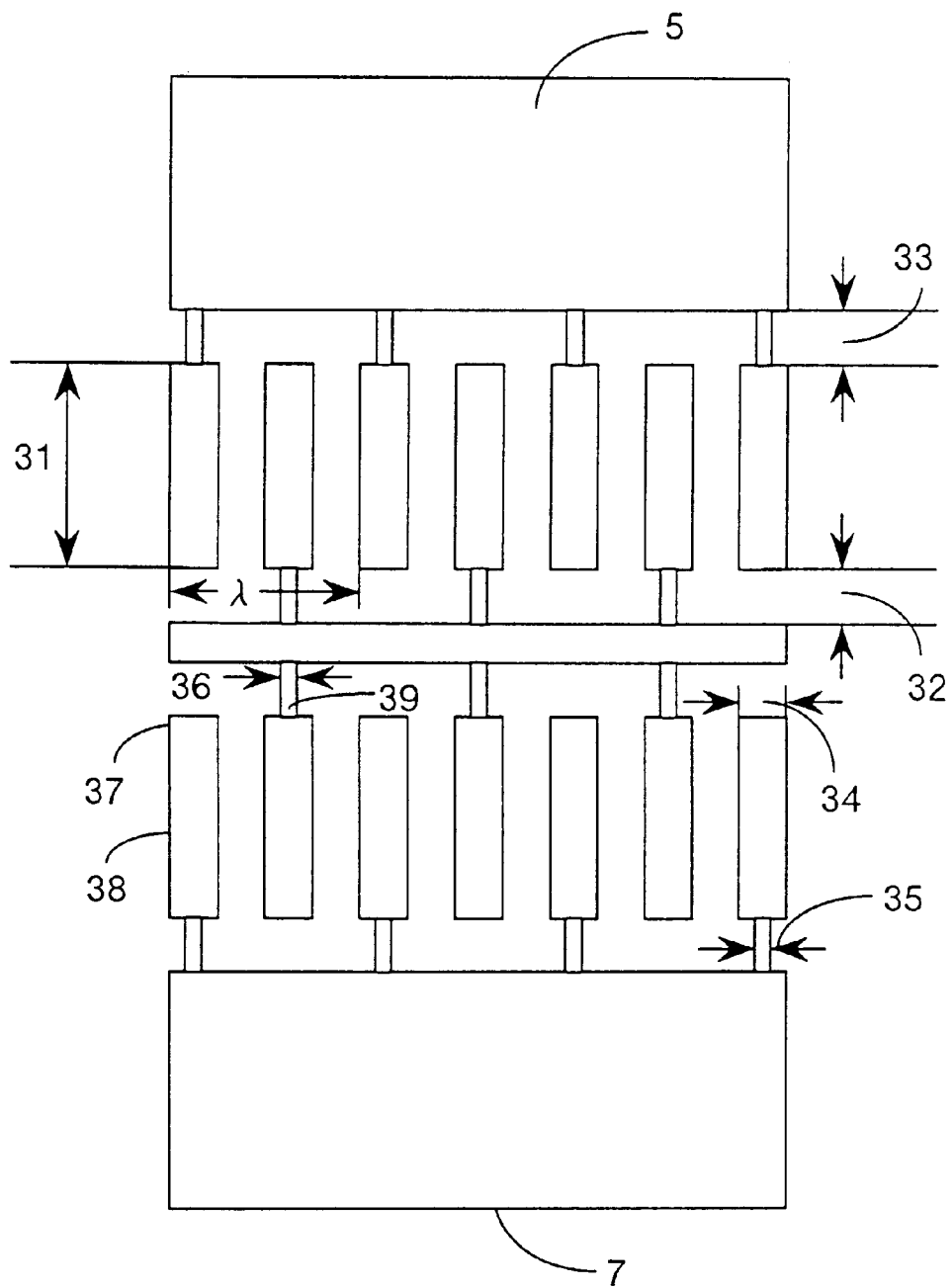
FIG. 4 is a view showing a construction of IDT in the surface acoustic wave filter of the present invention.

FIG. 4 shows a construction of IDT in a surface acoustic wave filter for reducing the second parasitic capacitance 116

(See FIG. 14) in accordance with the present invention. FIG. 4 illustrating a second embodiment of the present invention shows only a portion corresponding to the IDT of the surface acoustic wave filter shown in FIG. 1. A foot line width 36 of the electrode finger shown in FIG. 4 is different from the one in FIG. 1.

Referring to FIG. 4, the electrode fingers extend alternately from the terminal-side bus bar 5 and the connection-side bus bar 7 in an up-and-down direction of the document sheet. The portion at which the electrode fingers are overlapped with each other as viewed from a left-and-right direction of the document sheet, i.e. from a direction parallel to the propagation direction of the excited surface acoustic wave, is referred to as an electrode finger overlapped portion 31. The portions of the electrode finger at which the electrode fingers are not overlapped with each other are referred to as electrode finger non-overlapped portions 32, 33.

In FIG. 1, the width of the electrode finger is constant. In FIG. 4, the electrode finger width (the foot line width 35, 36) at the electrode finger non-overlapped portions 32, 33 is smaller than the electrode finger width 34 at the electrode finger overlapped portion 31. In such a construction, the distance between the right side of the tip 37 of the electrode finger 38 and the foot portion of the electrode finger 39 adjacent to the electrode finger 38 in FIG. 4 is longer than the one in FIG. 1, whereby the parasitic capacitance existing at this portion is reduced.

Figure 5:
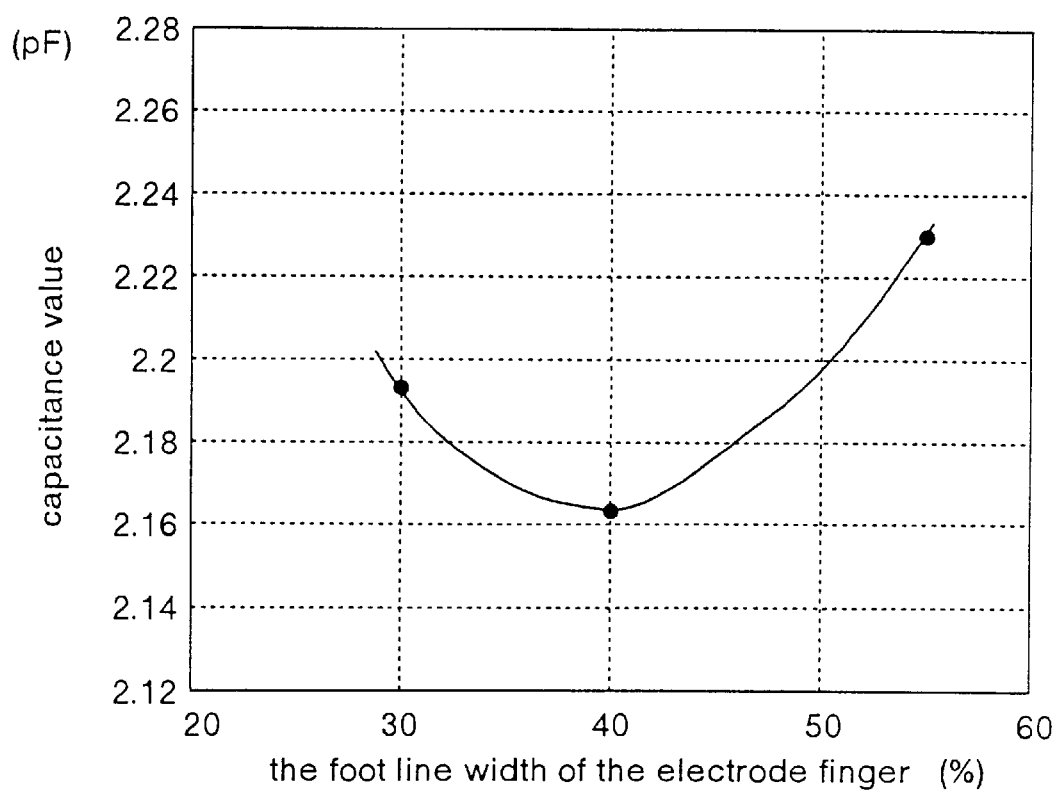
FIG. 5 is a graph representing a relationship between a foot line width of an electrode finger and a capacitance in an input impedance according to the present invention.

FIG. 5 is a graph showing a relationship between the foot line width of the electrode finger and the capacitance value contained in the input impedance according to the second embodiment of the present invention. Here, an ST-cut quartz is used for the piezoelectric substrate; the electrode period of the IDT is $\lambda$=12.5 $\mu$m; the electrode film thickness is 0.36 $\mu$m; and the electrode finger width (34) of the electrode finger overlapped portion 31 is 3.4375 $\mu$m (which is 55% of $\lambda$/2). FIG. 5 is a graph showing the cases in which the foot line width 35, 36 of the electrode finger non-overlapped portions 32, 33 is 55%, 40%, and 30% of $\lambda$/2.

FIG. 5 shows that the capacitance value is reduced by about 0.04 pF to 0.07 pF if the foot line width 35, 36 of the electrode finger is smaller (i.e. 40%, 30% of $\lambda$/2) than the electrode finger width 34, as compared with the case in which the foot line width 35, 36 is the same (i.e. 55% of $\lambda$/2) as the electrode finger width 34. This seems to be because the second parasitic capacitance existing between the tip 37 of the electrode finger and the foot portion of the adjacent electrode finger has been reduced. Thus, the second parasitic capacitance 116 is reduced without addition of an external circuit by partially reducing the width of the electrode finger.

Also, the above-described reduction of parasitic capacitance is especially effective for a quartz substrate having a small relative dielectric constant.

This is because, in the case of piezoelectric substrate formed of a material such as LiNbO$_3$ or LiTaO$_3$ having a large relative dielectric constant, it is possible to change the input impedance for providing impedance matching by also adjusting the number of electrode finger pairs and the overlapping width of electrode fingers in IDT in addition to reduction of the parasitic capacitance.

EXAMPLES

The present invention is now explained by way of embodiments showing reduction of parasitic capacitance. These embodiments are given only for exemplary purposes and are not limitative of the present invention.

Embodiment 1

This shows an embodiment of a surface acoustic wave filter including multimode filters of transversal coupling type connected in two-stage connection in which the width of the connection-side bus bar is sufficiently small and is smaller than the width of the terminal-side bus bar. The view showing the construction of this embodiment is similar to the one shown in FIG. 1.

The piezoelectric substrate is an ST-cut quartz; the electrode period of the IDT is $\lambda$=12.5 $\mu$m; the thickness of the electrode film is 0.36 $\mu$m; the overlapping width of the electrode fingers is 7$\lambda$; the number of electrode pairs is 250; the width of the terminal-side bus bar is 15$\lambda$; and the width of the connection-side bus bar is 1$\lambda$. The connection-side bus bar and the terminal-side bus bar each have a rectangular shape and their length along the up-and-down direction of the document sheet is the same, so that the electrode area of the connection-side bus bar is 1/15 of the electrode area of the terminal-side bus bar.

Figure 6:
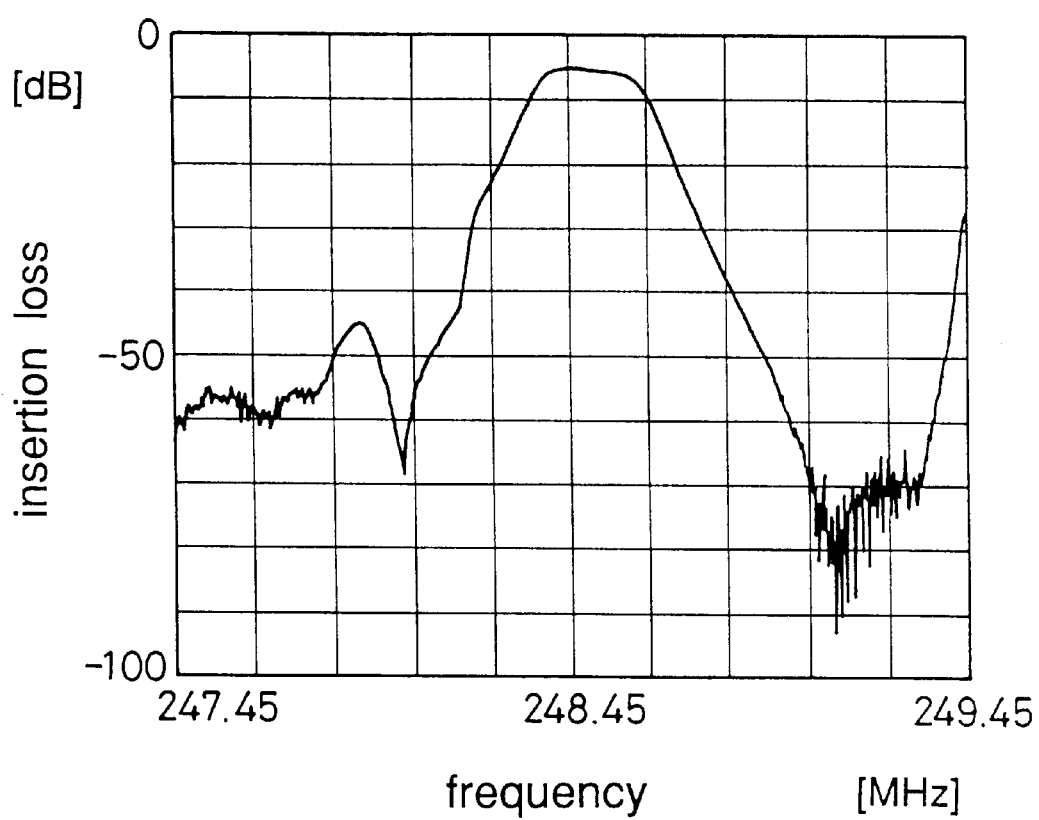
FIG. 6 is a graph representing frequency relative to insertion loss characteristics when the width of the connection-side bus bar is $1\lambda$ according to the present invention.

FIG. 6 shows filter characteristics (insertion loss relative to frequency) when the width of the connection-side bus bar is 1$\lambda$ according to the present invention.

Figure 7:
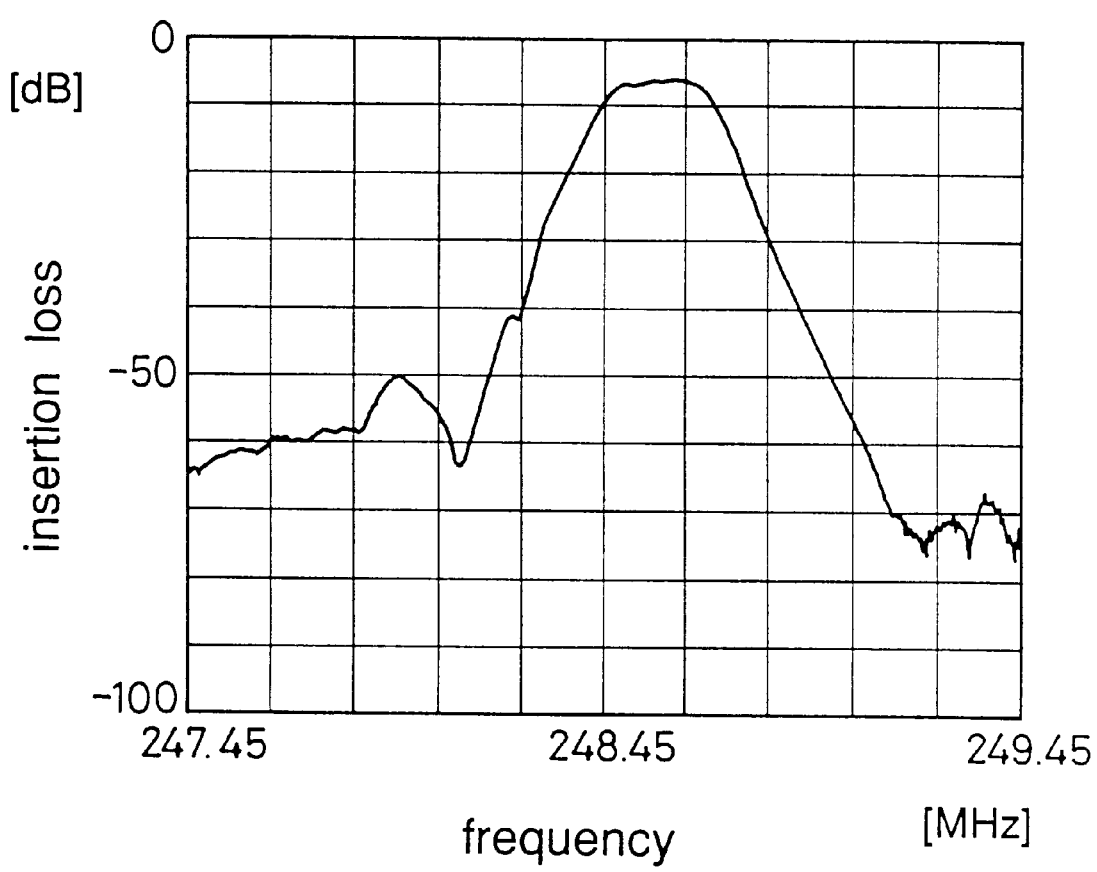
FIG. 7 is a graph representing frequency relative to insertion loss characteristics when the width of the connection-side bus bar is $15\lambda$ according to the present invention.

FIG. 7 shows filter characteristics (insertion loss relative to frequency) when the width of the connection-side bus bar is 15$\lambda$, as a comparison with FIG. 6.

Comparing FIGS. 6 and 7, it is understood that, in the pass band, the insertion loss in FIG. 6 is about 5.2 dB, whereas the insertion loss in FIG. 7 is about 5.8 dB, showing an improvement of about 0.6 dB in the insertion loss according to the construction of Embodiment 1. In other words, by allowing the electrode area of the connection-side bus bar to be about 1/15 of the electrode area of the terminal-side bus bar, the parasitic capacitance can be decreased to reduce the impedance mismatching.

Embodiment 2

Figure 8:
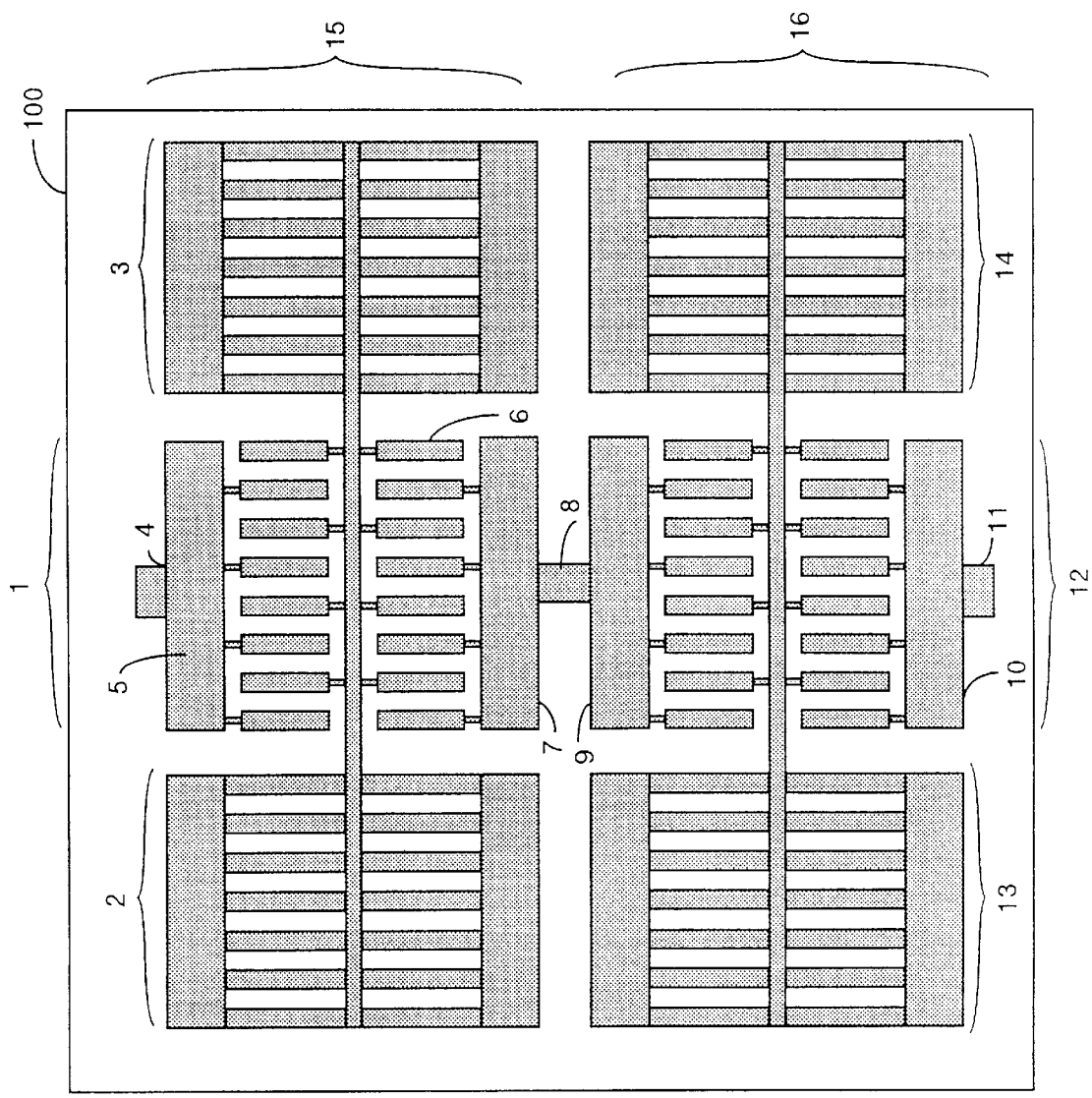
FIG. 8 is a view showing a construction of a surface acoustic wave filter according to a second embodiment of the present invention.

This shows an embodiment of a surface acoustic wave filter including multimode filters of transversal coupling type connected in two-stage connection in which the foot line width of the electrode fingers is smaller than the width of the electrode fingers in IDT. FIG. 8 is a view showing a construction of the surface acoustic wave filter according to Embodiment 2 of the present invention.

The piezoelectric substrate is an ST-cut quartz; the electrode period of the IDT is $\lambda$=12.5 $\mu$m; the thickness of the electrode film is 0.36 $\mu$m; the overlapping width of the electrode fingers is 7$\lambda$; the number of electrode pairs in IDT is 250; the number of electrodes in the reflector is 120; the width of the connection-side bus bar and the terminal-side bus bar is 15$\lambda$.

Also, as shown in FIG. 4, the electrode finger width 34 in IDT at the electrode finger overlapping portion 31 is set to be 55% of $\lambda$/2, and the foot line width 35, 36 of the electrode finger in IDT is set to be smaller than the electrode finger width 34 (i.e. 40% of $\lambda$/2).

In this case, the parallel capacitance contained in the input impedance is illustrated by the same graph as shown in FIG. 5. Namely, according as the foot line width is reduced, the parallel capacitance decreases when compared with the case in which the line width of the electrode finger is not reduced (i.e. 55% of $\lambda$/2). This means a reduction of the parasitic capacitance.

Figure 9:
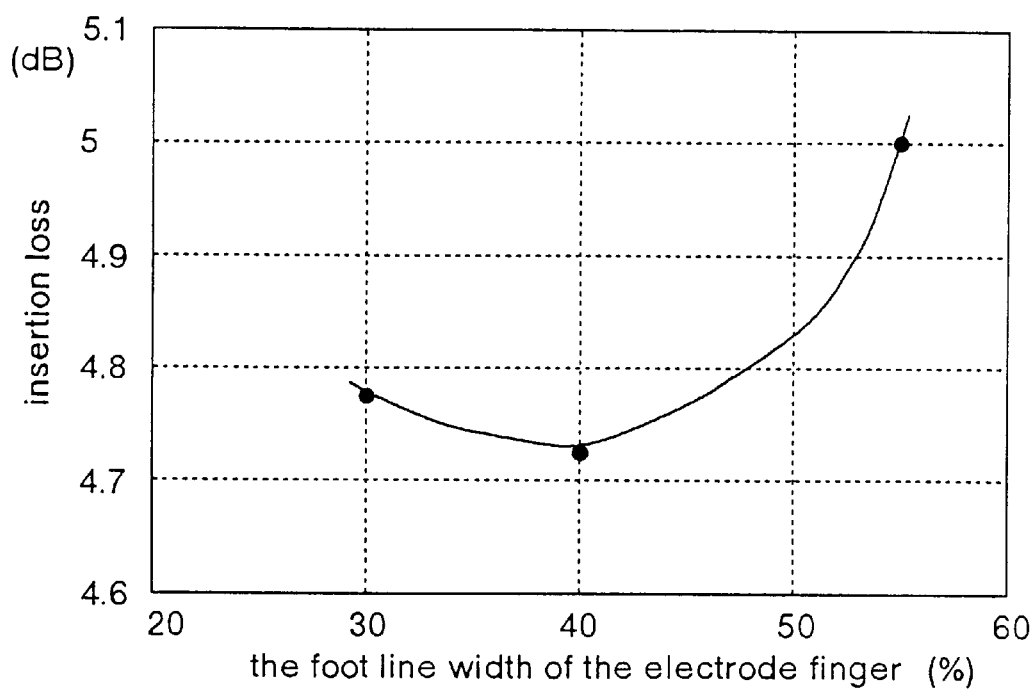
FIG. 9 is a graph representing a relationship between a foot line width of an electrode finger and an insertion loss according to the second embodiment of the present invention.

FIG. 9 is a graph showing the filter insertion loss relative to the foot line width of the electrode finger according to Embodiment 2. Referring to FIG. 9, it is understood that the filter insertion loss decreases by about 0.2 to 0.3 dB if the foot line width 35, 36 of the electrode finger is smaller than the electrode finger width 34 (i.e. where the foot line width 35, 36 is 40% of λ/2, as contrasted with the case where the electrode finger width 34 is 55% of λ/2).

Further, it is understood from FIGS. 5 and 9 that the parasitic capacitance and the filter insertion loss attain their minimum when the foot line width of the electrode finger is 40% of λ/2. Thus, since the foot line width of the electrode finger in IDT is smaller than the electrode finger width at the electrode finger overlapped portion of IDT in Embodiment 2, reduction of parasitic capacitance and improvement in filter insertion loss can be achieved, thereby reducing the impedance mismatching.

Although the above-described Embodiments 1 and 2 each show a construction of a multimode filter of transversal coupling type, it is also possible to reduce the parasitic capacitance and to reduce the impedance mismatching in the case of a multimode filter of longitudinal coupling type.

Figure 10:
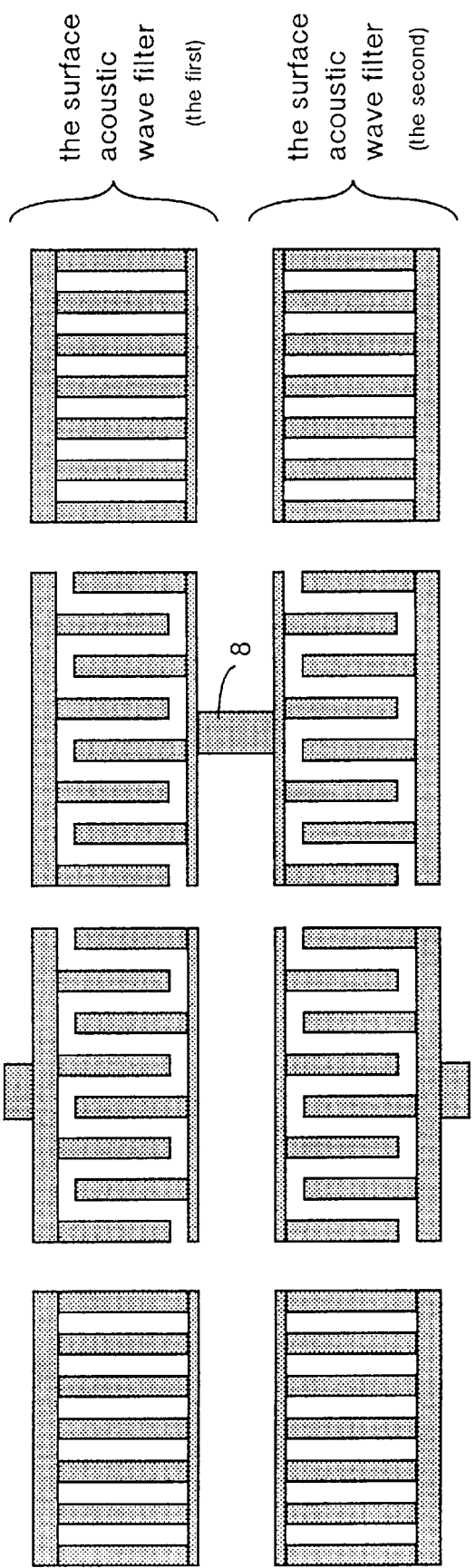
FIG. 10 is a view showing a construction of a multi-mode filter of longitudinal coupling type (when an area of a connection-side bus bar is reduced) according to the present invention.

FIG. 10 shows a construction of a multimode filter of longitudinal coupling type in which the electrode area of the connection-side bus bar is reduced (for example, to 1λ). Here, each surface acoustic wave filter is composed of two IDTs, one of the IDTs being interconnected by a metal electrode film at a connection portion. The reduction of electrode area can be achieved, for example, by allowing the connection-side bus bar to have a width of about 1λ.

Figure 11:
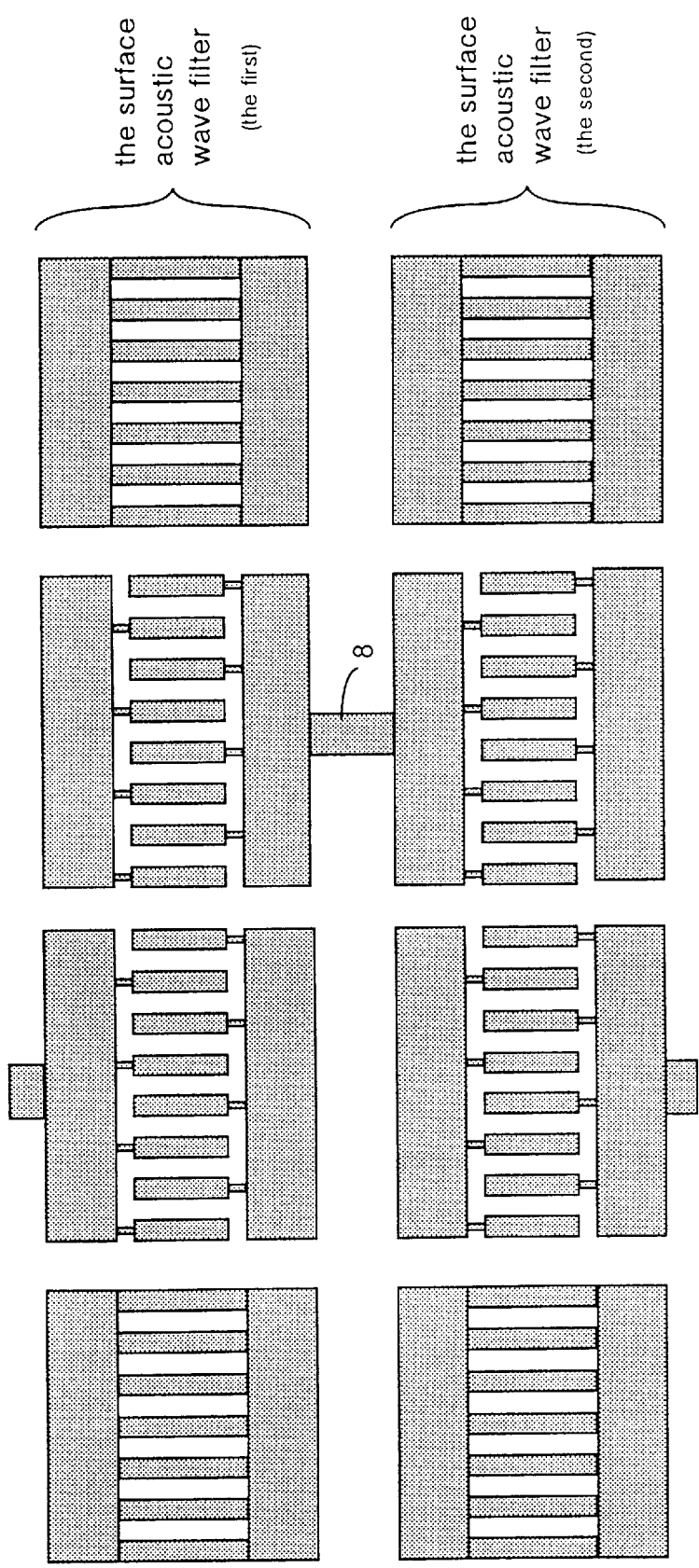
FIG. 11 is a view showing a construction of a multi-mode filter of longitudinal coupling type (when a foot line width of an electrode finger of IDT is reduced) according to the present invention.
Figure 12:
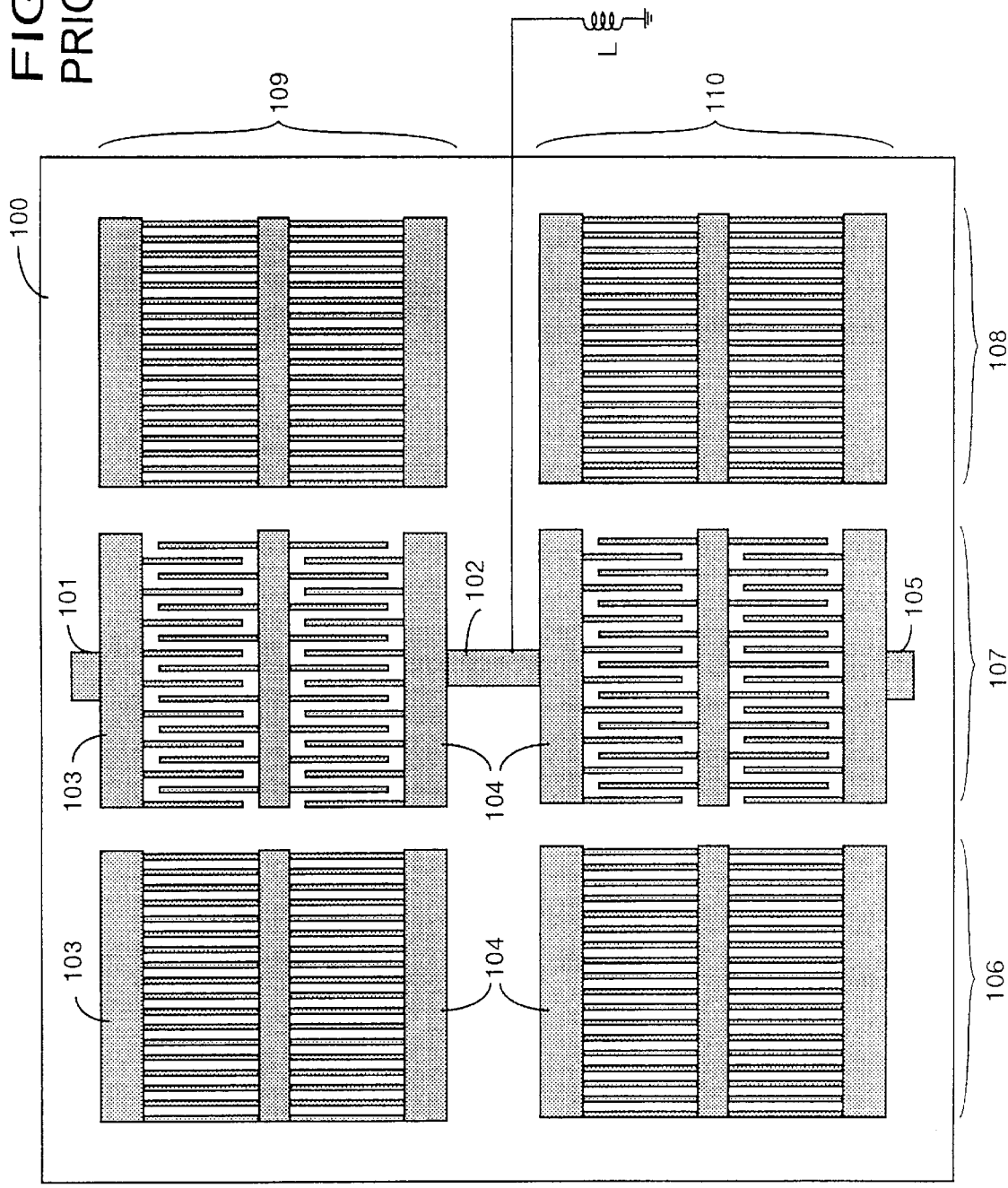
FIG. 12 is a view showing a construction of a conventional surface acoustic wave filter in multi-stage connection.
Figure 13:
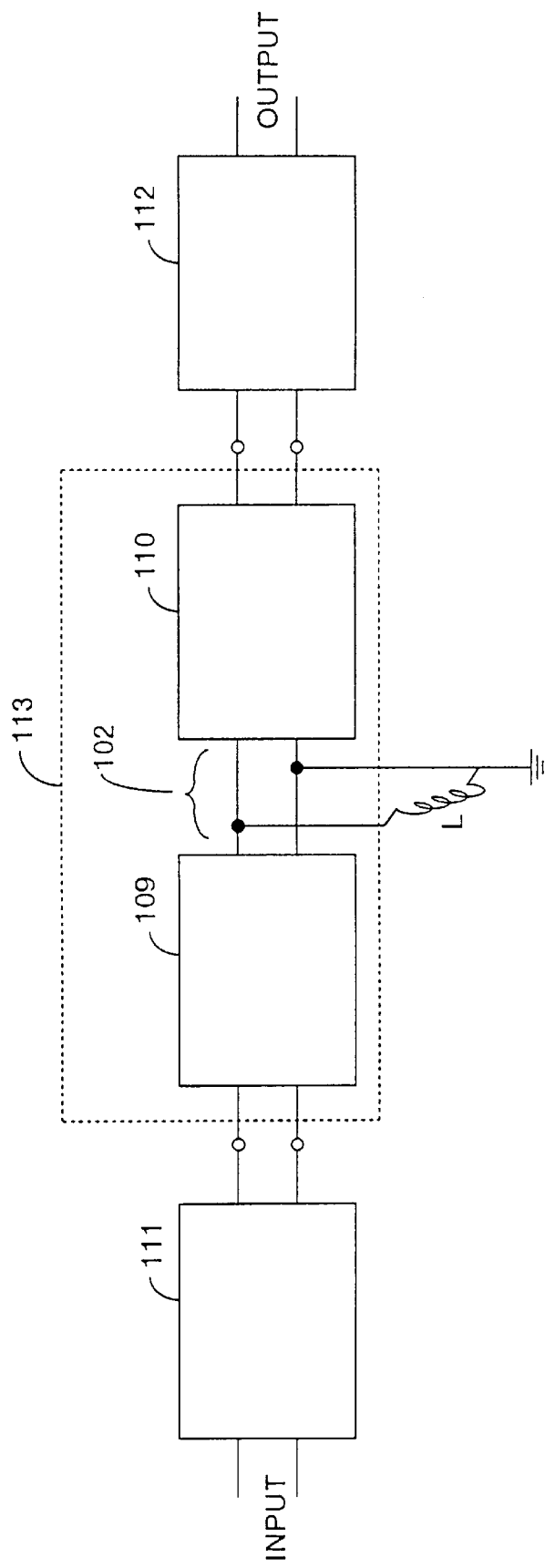
FIG. 13 is a circuit block diagram of the conventional surface acoustic wave filter.

FIG. 11 shows a construction of a multimode filter of longitudinal coupling type in which the foot line width of the non-overlapped portion of the electrode finger in IDT is smaller than the electrode finger width of the overlapped portion of the electrode finger in IDT.

When each IDT is allowed to have a dimension similar to those shown in Embodiments 1 and 2, the multimode filters of longitudinal coupling type shown in FIGS. 10 and 11 can also provide characteristics similar to those shown in FIGS. 2, 3, 5, and 9, achieving reduced parasitic capacitance and reduced impedance mismatching.

As shown above, the present invention provides reduced impedance mismatching, since the parasitic capacitance existing in each surface acoustic wave filter connected in multi-stage connection and in the connection section is reduced to be less than a predetermined value.

Also, the parasitic capacitance formed between the connection-side bus bar and the grounding point of the surface acoustic wave filter can be reduced as compared with the conventional filter construction, since the electrode area of the connection-side bus bar of IDT connected to the connection section is sufficiently small and is smaller than the electrode area of the terminal-side bus bar.

Further, the parasitic capacitance existing in IDT can be reduced, since the foot line width of the non-overlapped portion of the electrode finger constituting the IDT is smaller than the electrode finger width of the overlapped portion.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A surface acoustic wave filter of multi-stage connection type comprising:
    a plurality of surface acoustic wave filters formed on a piezoelectric substrates; and
    a connection section for electrically connecting at least two of the surface acoustic wave filters in a cascade connection,
    each of the surface acoustic wave filters comprising interdigital transducers including an excitation section for exciting a surface acoustic wave and two terminal sections disposed on opposite sides of the excitation section, the two terminal sections serving as input or output terminal for an electric signal,
    wherein one of the terminal sections is connected to the connection section, and an electrode area of said one section is such that a parasitic capacitance formed between said one terminal section and a grounding point of the surface acoustic wave filter is less than or equal to 0.01 pF.

2. A surface acoustic wave filter of multi-stage connection type comprising:
    a plurality of surface acoustic wave filters formed on a piezoelectric substrate; and
    a connection section for electrically connecting at least two of the surface acoustic wave filters in a cascade connection,
    each of the surface acoustic wave filters comprising interdigital transducers including an excitation section for exciting a surface acoustic wave and two terminal sections disposed on opposite sides of the excitation section, the two terminal sections serving as input or output terminal for an electric signal,
    wherein one of the terminal sections is connected to the connection section, and an electrode area of said one of the terminal sections connected to the connection section is less than an electrode area of the other of the signal terminal sections of the interdigital transducer in which said one of the terminal sections is included.

3. A surface acoustic wave filter of multi-stage connection type according to claim 2, wherein the electrode area of said one of the signal terminal sections is less than or equal to 1/15 of an electrode area of said other signal terminal section.

4. A surface acoustic wave filter of multi-stage connection type comprising:
    a plurality of surface acoustic wave filters formed on a piezoelectric substrate; and
    a connection section for electrically connecting at least two of the surface acoustic wave filters in a cascade connection,
    each of the surface acoustic wave filters comprising interdigital transducers including an excitation section for exciting a surface acoustic wave and two terminal sections disposed on opposite sides of the excitation section, the two terminal sections serving as input or output terminals for an electric signal,
    wherein the excitation section includes a ground terminal section disposed between the two terminal sections and a plurality of electrode fingers alternately extending from the two terminal sections and from the ground terminal section in a direction perpendicular to a propagation direction of the surface acoustic wave, and a width of an entire portion of an electrode finger which is in contact with the terminal section connected with the connection section and at which adjacent electrode fingers are not overlapped with each other is less than a width of an entire portion of the electrode finger at which the adjacent electrode fingers are overlapped with each other as viewed from a direction parallel to the propagation direction of the surface acoustic wave.

5. A surface acoustic wave filter of multi-stage connection type according to any one of claims 1, 2, 3 or 4, wherein the surface acoustic wave filter is a multimode filter of transversal coupling type.

6. A surface acoustic wave filter of multi-stage connection type according to claim 1, 2, 3 or 4, wherein the piezoelectric substrate is formed of quartz.

7. A surface acoustic wave filter of multi-stage connection type according to claim 5, wherein the piezoelectric substrate is formed of quartz.

* * * * *